(12) United States Patent
Goniakowski et al.

(10) Patent No.: US 11,193,210 B2
(45) Date of Patent: Dec. 7, 2021

(54) COATED METALLIC SUBSTRATE AND FABRICATION METHOD

(71) Applicants: ArcelorMittal, Luxembourg (LU); Centre National de la Recherche Scientifique, Paris (FR); Sorbonne Université, Paris (FR)

(72) Inventors: Jacek Goniakowski, Brétigny-sur-Orge (FR); Thi Ha Linh Le, Nantes (FR); Claudine Noguera, Epinay-sur-Orge (FR); Jacques Jupille, Paris (FR); Remi Lazzari, Villejuif (FR); Jean-Michel Mataigne, Senlis (FR); Alexey Koltsov, Neufgrange (FR); Remi Cavallotti, Cachan (FR); Daniel Chaleix, Verny (FR); Lucie Gaouyat, Angleur (BE)

(73) Assignee: ArcelorMittal, Luxembourg (LU)

( * ) Notice: Subject to any disclaimer, the term of this patent is extended or adjusted under 35 U.S.C. 154(b) by 88 days.

(21) Appl. No.: 16/609,388

(22) PCT Filed: May 31, 2018

(86) PCT No.: PCT/IB2018/053872
§ 371 (c)(1),
(2) Date: Oct. 29, 2019

(87) PCT Pub. No.: WO2018/220567
PCT Pub. Date: Dec. 6, 2018

(65) Prior Publication Data
US 2020/0141008 A1    May 7, 2020

(30) Foreign Application Priority Data
May 31, 2017  (WO) .................. PCT/IB2017/000668

(51) Int. Cl.
C23C 2/04    (2006.01)
C23C 28/00   (2006.01)
(Continued)

(52) U.S. Cl.
CPC ............ C23C 28/345 (2013.01); B32B 15/00 (2013.01); B32B 15/012 (2013.01);
(Continued)

(58) Field of Classification Search
CPC ..... C23C 30/00; C23C 30/005; C23C 28/345; C23C 28/3225; C23C 28/42;
(Continued)

(56) References Cited

U.S. PATENT DOCUMENTS 9,670,576 B2    6/2017  Monnyer et al.
2002/0192494 A1* 12/2002 Tzatzov ................ C23C 28/00
                                              428/655
(Continued)

FOREIGN PATENT DOCUMENTS

CN    85109342 A    10/1986
CN    1433486      7/2003
(Continued)

OTHER PUBLICATIONS

International Search Report of PCT/IB2018/053872, dated Jul. 27, 2018.

*Primary Examiner* — Michael E. La Villa
(74) *Attorney, Agent, or Firm* — Davidson, Davidson & Kappel, LLC

(57) ABSTRACT

A coated metallic substrate is provided, including, at least; one layer of oxides, such layer being directly topped by an intermediate coating layer comprising Fe, Ni, Cr and Ti wherein the amount of Ti is above or equal to 5 wt. % and wherein the following equation is satisfied: 8 wt. %<Cr+Ti<40 wt. %, the balance being Fe and Ni, such intermediate
(Continued)

coating layer being directly topped by a coating layer being an anticorrosion metallic coating.

26 Claims, 2 Drawing Sheets

(51) Int. Cl.
| | |
|---|---|
| C23C 14/24 | (2006.01) |
| C23C 14/35 | (2006.01) |
| C22C 38/50 | (2006.01) |
| C22C 18/04 | (2006.01) |
| C22C 21/02 | (2006.01) |
| C25D 3/56 | (2006.01) |
| C22C 38/00 | (2006.01) |
| C25D 5/36 | (2006.01) |
| C23C 14/16 | (2006.01) |
| C23C 22/00 | (2006.01) |
| B32B 15/00 | (2006.01) |
| C23C 16/06 | (2006.01) |
| C23C 16/44 | (2006.01) |
| B32B 15/04 | (2006.01) |
| C23C 14/14 | (2006.01) |
| C23C 14/22 | (2006.01) |
| C23C 14/34 | (2006.01) |
| B32B 15/01 | (2006.01) |
| B32B 15/20 | (2006.01) |
| C23C 30/00 | (2006.01) |
| B32B 15/18 | (2006.01) |
| C22C 22/00 | (2006.01) |

(52) U.S. Cl.
CPC .......... *B32B 15/013* (2013.01); *B32B 15/015* (2013.01); *B32B 15/04* (2013.01); *B32B 15/043* (2013.01); *B32B 15/18* (2013.01); *B32B 15/20* (2013.01); *C22C 18/04* (2013.01); *C22C 21/02* (2013.01); *C22C 22/00* (2013.01); *C22C 38/00* (2013.01); *C22C 38/50* (2013.01); *C23C 2/04* (2013.01); *C23C 14/14* (2013.01); *C23C 14/16* (2013.01); *C23C 14/165* (2013.01); *C23C 14/22* (2013.01); *C23C 14/24* (2013.01); *C23C 14/34* (2013.01); *C23C 14/3457* (2013.01); *C23C 14/35* (2013.01); *C23C 16/06* (2013.01); *C23C 16/44* (2013.01); *C23C 22/00* (2013.01); *C23C 28/00* (2013.01); *C23C 28/30* (2013.01); *C23C 28/321* (2013.01); *C23C 28/322* (2013.01); *C23C 28/3225* (2013.01); *C23C 28/3455* (2013.01); *C23C 28/42* (2013.01); *C23C 30/00* (2013.01); *C23C 30/005* (2013.01); *C25D 3/562* (2013.01); *C25D 5/36* (2013.01); *Y10T 428/1266* (2015.01); *Y10T 428/1275* (2015.01); *Y10T 428/1291* (2015.01); *Y10T 428/12611* (2015.01); *Y10T 428/12618* (2015.01); *Y10T 428/12667* (2015.01); *Y10T 428/12729* (2015.01); *Y10T 428/12736* (2015.01); *Y10T 428/12743* (2015.01); *Y10T 428/12757* (2015.01); *Y10T 428/12764* (2015.01); *Y10T 428/12771* (2015.01); *Y10T 428/12792* (2015.01); *Y10T 428/12799* (2015.01); *Y10T 428/12806* (2015.01); *Y10T 428/12847* (2015.01); *Y10T 428/12854* (2015.01); *Y10T 428/12861* (2015.01); *Y10T 428/12903* (2015.01); *Y10T 428/12917* (2015.01); *Y10T 428/12924* (2015.01); *Y10T 428/12931* (2015.01); *Y10T 428/12937* (2015.01); *Y10T 428/12944* (2015.01); *Y10T 428/12951* (2015.01); *Y10T 428/12972* (2015.01); *Y10T 428/12979* (2015.01); *Y10T 428/12993* (2015.01); *Y10T 428/2495* (2015.01); *Y10T 428/24959* (2015.01); *Y10T 428/24967* (2015.01); *Y10T 428/24975* (2015.01); *Y10T 428/26* (2015.01); *Y10T 428/263* (2015.01); *Y10T 428/264* (2015.01); *Y10T 428/265* (2015.01)

(58) Field of Classification Search
CPC ... C23C 28/3455; C23C 28/322; C23C 28/30; C23C 28/00; C23C 28/321; C23C 16/44; C23C 16/06; C23C 14/16; C23C 14/165; C23C 14/24; C23C 14/35; C23C 14/14; C23C 14/22; C23C 14/34; C23C 14/3457; C23C 2/04; C23C 22/00; C22C 38/00; C22C 38/50; C22C 18/04; C22C 21/02; C22C 22/00; C25D 5/36; C25D 3/562; Y10T 428/2495; Y10T 428/24959; Y10T 428/24967; Y10T 428/24975; Y10T 428/26; Y10T 428/263; Y10T 428/264; Y10T 428/265; Y10T 428/1266; Y10T 428/12667; Y10T 428/12931; Y10T 428/12937; Y10T 428/12944; Y10T 428/12951; Y10T 428/12847; Y10T 428/12854; Y10T 428/12806; Y10T 428/12972; Y10T 428/12979; Y10T 428/12993; Y10T 428/12736; Y10T 428/12743; Y10T 428/1275; Y10T 428/12757; Y10T 428/12764; Y10T 428/12903; Y10T 428/1291; Y10T 428/12917; Y10T 428/12924; Y10T 428/12792; Y10T 428/12799; Y10T 428/12861; Y10T 428/12729; Y10T 428/12771; Y10T 428/12611; Y10T 428/12618

See application file for complete search history.

(56) References Cited

U.S. PATENT DOCUMENTS

| | | |
|---|---|---|
| 2013/0171471 A1 | 7/2013 | Bullard et al. |
| 2013/0252022 A1 | 9/2013 | Bullard et al. |
| 2015/0044499 A1 | 2/2015 | Maki et al. |
| 2017/0114467 A1 | 4/2017 | Chaleix |
| 2019/0233934 A1 | 8/2019 | Chaleix |

FOREIGN PATENT DOCUMENTS

| | | |
|---|---|---|
| CN | 103348034 A | 10/2013 |
| CN | 103764388 A | 4/2014 |
| EP | 0183052 B1 | 12/1991 |
| JP | H01136975 | 5/1989 |
| JP | H0428852 A | 1/1992 |
| JP | 2006-334606 A | 12/2006 |
| JP | 2016-530401 A | 9/2016 |
| KR | 2018-0069126 | 6/2018 |
| RU | 2139793 C1 | 10/1999 |
| RU | 2598017 C2 | 9/2016 |
| WO | WO01/94664 A2 | 12/2001 |
| WO | 2014124749 A1 | 8/2014 |
| WO | WO 2014124749 A1 | 8/2014 |
| WO | 2015150850 A1 | 10/2015 |
| WO | WO2015/150850 | 10/2015 |

\* cited by examiner

Figure 3

| 38 | Anti-corrosion metal coating 2 |
|---|---|
| 37 | Fe-Cr-Ni-Ti |
| 36 | Oxides |
| 34 | Anti-corrosion metal coating 1 |
| 33 | Fe-Cr-Ni-Ti |
| 32 | Oxides |
| 31 | Steel |

COATED METALLIC SUBSTRATE AND FABRICATION METHOD

This invention relates to a coated metallic substrate and a method for the fabrication thereof. The coated metallic substrate is particularly suited for the manufacture of automotive vehicle.

BACKGROUND

Steel sheets are generally covered with a metallic coating, the composition of which varies as a function of the final use of the steel sheet. This coating can, for example, be zinc, aluminum, magnesium or their alloys, can include one or more layers and can be applied using different coating technologies known to a person skilled in the art, such as, for example, vacuum deposition methods, hot-dip coating or electro-deposition.

Usually, the metal coating is deposited by hot-dip coating, whereby this process generally comprises the following steps:
- Annealing of the steel sheet as it passes through a furnace under an inert or reducing atmosphere to limit the oxidation of the surface of the sheet;
- Hot dip-coating of the sheet as it passes through a bath of metal or metal alloy in the liquid state so that when it exits the bath, the sheet is coated with the metal/metal alloy.
- After the sheet exits the liquid bath, the layer of metal/metal alloy is wiped by spraying a gas on the surface to guarantee a uniform and regular thickness of this layer.

During the annealing step, before the steel sheet enters the metal bath (in the following portion of the text the terms "metal bath" and "metal layer" are also used to designate any metal alloy bath and the corresponding metal alloy layers) the sheet is generally heated in a direct flame or radiant tube annealing furnace. However, in spite of numerous measures that are taken, such as the control of an inert atmosphere, the use of these furnaces to heat the steel sheet can lead to the formation of metal oxides on the surface, which hinder the proper wettability of the liquid metal on the surface of the steel sheet and induce the occurrence of uncoated areas on the surface of the sheet.

This problem is encountered in particular when the composition of the steel includes significant quantities of easily oxidized elements such as Si, Mn, Al, Cr, B, P etc. For example, an IF (Interstitial-Free) steel that contains 0.2% by weight Mn, 0.02% by weight Si and 5 ppm B is already subject to these problems of wettability as a result of the presence of B which rapidly diffuses to the surface of the sheet and precipitates mixed oxides of Mn, B and Si in the form of continuous films, leading to poor wetting.

More generally, the risk of poor wetting by the liquid metal is also encountered in all high-strength steels because they contain at least one of these elements more prone to oxidation than iron, such as Dual Phase steels, TRIP (Transformation Induced Plasticity) steels, TWIP (TWinning-Induced Plasticity), electrical steels, etc.

For Dual Phase steels, the quantity of Mn is generally less than 3% by weight, with the addition of Cr, Si or Al in quantities generally less than 1% by weight. For TRIP steels, the quantity of Mn is generally less than 2% by weight associated with a maximum of 2% by weight of Si or Al. For TWIP steels, the quantity of Mn can be up to 25% by weight, combined with Al or Si (maximum 3% by weight).

The metal coating can also be applied by electro-deposition. Usually, prior to the electro-deposition process, the steel sheets must undergo a pickling step to remove the metal oxides that are present on the surface. In fact, for the electrolysis process to be effective, the medium must necessarily be a conductor, which is not the case if metal oxides are present on the surface of the steel sheet to be coated. Moreover, the presence of metal oxides can influence the coating deposition and thus lead to problems of adherence and quality of the coating (microstructure, density etc.).

The metal coating can also be applied by vacuum deposition. A distinction is made among different types of vacuum deposits as a function of, among other things, the means used to form the vapor phase. If the vapor phase results from a chemical reaction or the decomposition of a molecule, the process is called CVD, or chemical vapor deposition. On the other hand, if this vapor is produced by a purely physical phenomenon such as thermal evaporation or ion sputtering, the process is a physical vapor deposition or PVD. PVD deposition processes include sputtering, ion implantation and vacuum evaporation.

However, usually, regardless of the vacuum deposition technique used, a preparation of the surface is required so that the surface of the steel sheet to be coated is free of metal oxides to guarantee the proper adherence of the metal coating and to thereby prevent problems of delamination of the coating.

Regardless of the coating method used, the surface condition of the steel strip before coating is an important factor in the quality of the final coating. The presence of metal oxides on the surface of the steel sheet to be coated prevents the proper adherence of the coating to be applied and can result in zones in which there is no coating on the final product or problems related to the delamination of the coating. These metal oxides can be present in the form of a continuous film on the surface of the steel sheet or in the form of discontinuous points. The metal oxides can also be formed during different steps of the process and their composition varies as a function of the grade of steel of which the sheet in question is made. Oxides of this type include, for example, the iron oxides $FeO_x$, $Fe_3O_4$, $Fe_2O_3$, and iron hydroxides, aluminum oxide $Al_2O_3$ and aluminum hydroxides, silicon oxide ($SiO_x$), as well as mixed oxides $MnSi_xO_y$, $AlSi_xO_y$ or $MnB_xO_y$.

The removal of these metal oxides requires the execution of an additional process step, i.e. pickling. In the remainder of this description, pickling means any method that results in the removal of the metal oxides formed by oxidation of the underlying metal layer so that this metal layer appears on the surface, in comparison with, for example, a brightening method which, although it is a process that removes metal oxides, is intended only to remove the surface layer of metal oxides without exposing the underlying metal layer.

This removal of metal oxides can be accomplished, for example, by vacuum pickling by magnetron pulverization, which is also called etching. It is also possible to pickle the strip by passing it through one or more successive baths of strong acids such as hydrochloric acid or sulfuric acid. Finally, it is possible to remove all or part of the layers of metal oxides by mechanical action, for example by using a shot-blasting process in which the metal oxides are removed. However, these methods are always difficult to control and to implement at industrial scale.

One known surface treatment permits to avoid the removal of the oxide layer present on a metallic substrate. Indeed, the patent application WO2015/150850 discloses a substrate including a plurality of layers, at least one of which includes metal oxides and is directly topped by a layer of metal coating that contains at least 8% by weight nickel and at least 10% by weight chromium, the rest being iron, additional elements and impurities resulting from the fabrication process, this metal coating layer being itself directly topped by an anti-corrosion coating layer. For example, the layer of metal coating is 316 stainless steel including 16-18% by weight Cr and 10-14% by weight Ni, the balance being Fe. This layer of metal coating improves the adherence of a subsequent coating on the substrate and does not require a step to eliminate the oxides present on the surface.

However, this surface treatment comprising the addition of a layer of metal coating, containing nickel, chromium and iron, on a metallic substrate is the only known surface treatment and therefore the one available on the market which does not require a step to eliminate the oxides present on the substrate surface.

SUMMARY OF THE INVENTION

It is an object of the present invention to provide another surface treatment method that makes it possible to, among other things, improve the adherence of a subsequent coating on the substrate and that does not require a step to eliminate the oxides present on the surface.

The present invention provides a coated metallic substrate comprising, at least; one layer of oxides, such layer being directly topped by an intermediate coating layer comprising Fe, Ni, Cr and Ti wherein the amount of Ti is above or equal to 5 wt. % and wherein the following equation is satisfied: 8 wt. %<Cr+Ti<40 wt. %, the balance being Fe and Ni, such intermediate coating layer being directly topped by a coating layer being an anticorrosion metallic coating.

The present invention also provides a method for the manufacture of the coated metallic substrate.

Other characteristics and advantages of the invention will become apparent from the following detailed description of the invention.

BRIEF DESCRIPTION OF THE DRAWINGS

To illustrate the invention, various embodiments and trials of non-limiting examples will be described, particularly with reference to the following Figure:

FIG. 3 is a schematic illustration of a substrate in a third embodiment of the invention.

DETAILED DESCRIPTION

Figure 1:
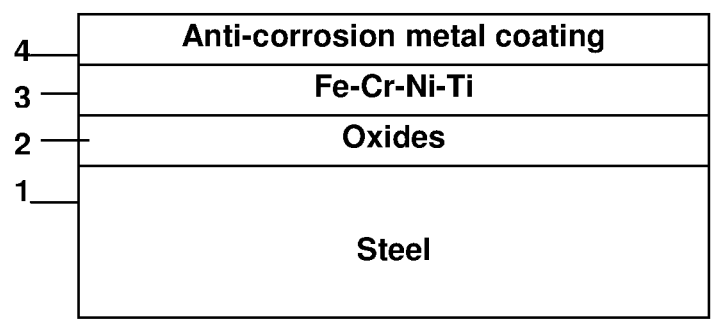
FIG. 1 is a schematic illustration of a substrate in a first embodiment of the invention.

In all the figures, the thickness of the layers represented is exclusively for purposes of illustration and cannot be considered to be a representation of the different layers to scale.

The following terms will be defined:

All percentages "%" of are defined by weight.

The designation "steel" or "steel sheet" includes all known grades of steel and can be, for example, one of the following grades of HSS (High Strength Steel, generally between 450 and 900 MPa) or AHSS (Advanced High Strength Steels, generally greater than 900 MPa), steel which contain large quantities of oxidizable elements:

Steels without interstitial elements (IF—Interstitial Free), which can contain up to 0.1% by weight Ti;

Dual-phase steels such as DP 500 steels up to DP 1200 steels which can contain up to 3% by weight Mn in association with up to 1% by weight Si, Cr and/or Al, TRIP (TRansformation Induced Plasticity) steels such as TRIP 780, which contains, for example, approximately 1.6% by weight Mn and 1.5% by weight Si;

TRIP or dual-phase steels containing phosphorus;

TWIP (TWinning-Induced Plasticity) steels—steels that have a high content of Mn (generally 17-25% by weight), Low-density steels such as the Fe—Al steels which can contain, for example, up to 10% by weight Al;

Stainless steels, which have a high content of chromium (generally 13-35% by weight), in association with other alloy elements (Si, Mn, Al etc.).

For this purpose, the present invention provides a coated metallic substrate comprising, at least; one layer of oxides, such layer being directly topped by an intermediate coating layer comprising Fe, Ni, Cr and Ti wherein the amount of Ti is above or equal to 5 wt. % and wherein the following equation is satisfied: 8 wt. %<Cr+Ti<40 wt. %, the balance being Fe and Ni, such intermediate coating layer being directly topped by a coating layer being an anticorrosion metallic coating.

Without willing to be bound by any theory, it seems that the intermediate coating layer comprising Fe, Ni, Cr and Ti according to the present invention improves the adhesion of the subsequent coating and does not require the removal of the native oxides layer present on the metallic substrate. Indeed, it is believed that chromium or titanium oxides presents in the intermediate layer result in strong links at the interface between the native oxides present on the metallic substrate and the anticorrosion metallic coating.

It is believed that when Ti amount is below 5 wt. % by weight, there is a risk that the intermediate coating layer comprising Fe, Ni, Cr and Ti does not adhere well on the oxide layer. Moreover, when the amount of Cr and Ti is below 8 wt. %, there is a risk that the oxide layer is not covered enough on the surface of the steel sheet resulting in a bad adhesion of the anticorrosion metallic coating. Finally, when the amount of Cr+Ti is above 40 wt. %, there is a risk that the adhesion decreases since in the intermediate layer, weak links appear between the oxidized titanium and a Cr—Ti metallic layer resulting in a poor adherence of the metallic coating on the metallic substrate surface.

FIG. 1 illustrates a first embodiment in accordance with the present invention. In this example, the metallic substrate is a steel sheet 1 comprising a layer of oxides 2 on at least one of its surfaces. This oxide layer 2 can be continuous or discontinuous on the steel surface 1 and can include metal oxides from the group that includes the iron oxides, chromium oxides, manganese oxides, aluminum oxides, silicon oxides, boron oxides or one or more mixed oxides containing steel alloy elements such as mixed Mn—Si or Al—Si or Mn—B oxides. The thickness of this first layer of metal oxides 2 can vary, in general, from 3 to approximately 60 nm, for example, and preferably from 3 to approximately 20 nm.

The oxide layer 2 is therefore not removed and is covered with a intermediate coating layer 3 comprising Fe, Ni, Cr and Ti wherein the amount of Ti is above or equal to 5 wt. % and wherein the following equation is satisfied: 8 wt. %<Cr+Ti<40 wt. %, the balance being Fe and Ni. For example, this coating 3 can comprise 27 wt. % of Ni, 10 wt. % of Cr, 10 wt. % of Ti, the balance being Fe. The layer 3 of Fe-Ni-Cr-Ti metal coating is covered with a layer of anticorrosion metal coating 4.

According to the present invention, preferably, the intermediate coating layer comprises from 15 to 42 wt. %, more preferably from 22 to 40 wt. % and advantageously from 25 to 30 wt. % of Ni.

Preferably, the intermediate coating comprises from 10 to 60 wt. %, more preferably from 30 to 60 wt. %, of iron.

Advantageously, the intermediate coating comprises from 5 to 30 wt. %, preferably from 5 to 20 wt. %, of Ti.

Preferably, the intermediate coating comprises from 5 to 30 wt. %, more preferably from 5 to 20 wt. %, of Cr.

In a preferred embodiment, the intermediate coating layer has a thickness between 1 and 100 nm, preferably between 1 and 50 nm and more preferably between 1 and 20 nm.

In another preferred embodiment, the metallic substrate is directly coated with an anticorrosion layer, such anticorrosion layer being directly topped by the layer of oxides.

Preferably, the anti-corrosion coating layer(s) include a metal selected from among the group comprising zinc, aluminum, copper, magnesium, silicon, iron, titanium, nickel, chromium, manganese and their alloys.

More preferably, the anti-corrosion coating is an aluminum-based coating comprising less than 15% Si, less than 5.0% Fe, optionally 0.1 to 8.0% Mg and optionally 0.1 to 30.0% Zn, the remainder being Al.

In another preferred embodiment, the anti-corrosion coating is a zinc-based coating comprising 0.01-8.0% Al, optionally 0.2-8.0% Mg, the remainder being Zn.

The metallic substrate can be chosen from among: aluminum substrate, steel substrate, stainless steel substrate, copper substrate, iron substrate, copper alloys substrate, titanium substrate, cobalt substrate or nickel substrate. Preferably, the metallic substrate is a steel sheet.

Figure 2:
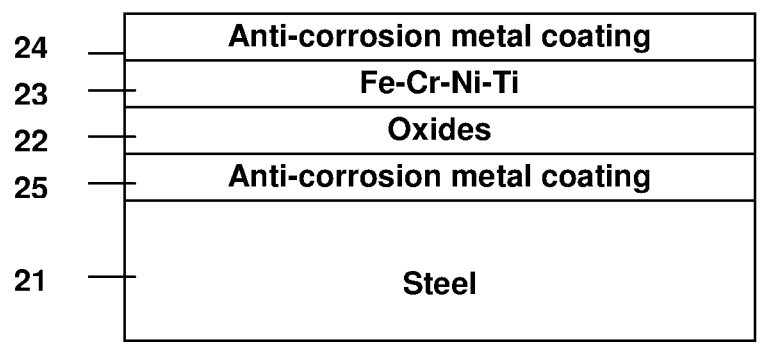
FIG. 2 is a schematic illustration of the substrate in a second embodiment of the invention.

FIG. 2 illustrates a second embodiment of the present invention. In this embodiment, the substrate is a steel sheet 21. This steel sheet 21 is coated with a layer of an anti-corrosion coating 25, such as, for example, an aluminum-based coating comprising between 9 and 12% by weight of Si. This aluminum-based coating 25 can have a thickness of between 10 and 30 μm, for example. This aluminum-based coating layer 25 is topped by a layer of metal oxides 22. This layer 22 can be continuous or discontinuous over the surface of the aluminum-based coating 25 in question and can include aluminum oxides and/or mixed aluminum oxides such as Al—Si oxides. The thickness of this layer of metal oxides 22 can in general vary from 3 to approximately 60 nanometers, preferably from 3 to approximately 20 nm.

This layer of oxides 22 is therefore not removed and is covered by a layer of an intermediate coating 23 comprising Fe, Ni, Cr and Ti wherein the amount of Ti is above or equal to 5 wt. % and wherein the following equation is satisfied: 8 wt. %<Cr+Ti<40 wt. %, the balance being Fe and Ni. For example, this coating 23 comprises 29 wt. % of Ni, 12 wt. % of Cr, 22 wt. % of Ti, the balance being Fe.

This layer of metal coating 23 in this second embodiment is topped by a layer of anti-corrosion metal coating 24, being for example a zinc-based coating. In this case, preferably, the zinc-based coating is a Zn—Mg alloy anti-corrosion coating comprising from 0.01 to 0.2% of Al, from 1.0 to 5% of Mg, the balance being Zn.

FIG. 3 illustrates a third embodiment of the present invention. In this third embodiment, the substrate is a steel sheet 31 comprising a first layer of oxides 32 on at least one of its surfaces.

The layer of oxides 32 is not removed and covered by a intermediate coating 33 comprising Fe, Ni, Cr and Ti wherein the amount of Ti is above or equal to 5 wt. % and wherein the following equation is satisfied: 8 wt. %<Cr+Ti<40 wt. %, the balance being Fe and Ni and impurities resulting from the fabrication process.

In this embodiment, the layer 33 of Fe—Ni—Cr—Ti metal coating is covered by a first layer of anti-corrosion metal coating 34. This first layer of anti-corrosion metal coating 34 can include, for example, pure zinc or zinc alloys such as Zn—Al, Zn—Al—Mg, Zn—Mg or Zn—Ni. It can also include aluminum, copper, magnesium, titanium, nickel, chromium, pure manganese (containing the potential impurities resulting from the fabrication process) or their alloys, such as, for example, Al—Si or Mg—Al.

In this third embodiment, the first layer of anti-corrosion metal coating 34 is topped by a second layer of metal oxides 36. This layer 36 can be continuous or discontinuous on the surface of the anti-corrosion metallic coating 34 and can include oxides, the composition of which depends on the constituent material of the anti-corrosion metal coating 34. For example, these oxides can be zinc oxides, aluminum oxides or mixed Al—Si, Zn—Mg or Zn—Al oxides. The thickness of this layer of metal oxides 36 can vary, in general, from 3 to approximately 60 nm, for example, and preferably from 3 to approximately 20 nm.

This second layer of oxides 36 is not eliminated and covered by a layer of a intermediate coating comprising Fe—Cr—Ni—Ti. The thickness of this layer of metal coating 37 can, for example, be greater than or equal to 2 nm.

In this third embodiment, this layer of metal coating 37 is topped by a second layer of anti-corrosion metal coating 38. For example, consideration can be given to a layer of steel 31, a first layer of iron oxides 32, a first intermediate coating 33 comprising Fe—Cr—Ni—Ti, a first anti-corrosion metal coating 34 consisting of an Al—Si alloy, a second layer of oxides 36 consisting of mixed Al-Si oxides, a second intermediate coating 37 comprising Fe—Cr—Ni—Ti and the second anti-corrosion metal coating 38 consisting of a Zn—Al—Mg alloy.

The present invention also relates to a method for the manufacture of said coated metallic substrate according to the present invention comprising the following steps:

A. The provision of a metallic substrate comprising at least one layer of oxides,
B. The deposition of the intermediate coating layer by vacuum deposition or electro-deposition process and
C. The deposition of the coating layer being the anticorrosion metallic coating.

Preferably, in step B), the deposition of the intermediate coating layer is performed by magnetron cathode pulverization process or jet vapor deposition process.

Preferably, in step C), the deposition of the coating layer is performed by a hot-dip coating, by electro-deposition process or by vacuum deposition. When the coating is deposited by vacuum deposition, it can be deposited by magnetron cathode pulverization process or jet vapor deposition process.

Preferably, the method does not comprise a pickling for removing the layer of oxides on the metallic substrate prior the deposition of the intermediate coating.

Finally, the present invention relates to the use of a coated metallic substrate for the manufacture of a part of an automotive vehicle.

The present invention will now be explained on the basis of tests performed for purposes of illustration only and not intended to be limiting.

EXAMPLE 1

Adhesion

A T-Bend test was performed. The purpose of this test is to determine the adherence of the coatings by bending the coated sheet at an angle of 180°. The bending radius applied is equal to twice the thickness of the substrate used (which corresponds to a "2T" bend). The adherence of the coating is verified by the application of an adhesive tape. The result of the test is judged positive if the coating remains on the tested sheet and does not appear on the adhesive tape after the tape is removed.

The adhesive tape used for the performance of this test in the tests described below is a commercial adhesive, TESA4104.

The composition of the steel used for the samples is 0.15% C, 1.9% Mn, 0.2% Si, 0.2% Cr, and 0.013% Ti. The percentages are percentages by weight, with the remainder being iron and potential impurities resulting from fabrication.

Trials 1 to 11 are comparative Examples.

Trials 1 to 9 are prepared according to WO2015/150850.

For Trial 10, the composition of the intermediate coating comprising Fe, Ni, Cr and Ti is as follows: 3% by weight of Cr, 15% by weight of Ni, 3% by weight of Ti, the balance being Fe.

For Trial 11, the composition of the intermediate coating comprising Fe, Ni, Cr and Ti is: 3% by weight of Cr, 40% by weight of Ni, 47% by weight of Ti, the balance being Fe.

For Trial 12, the composition of the intermediate coating comprising Fe, Ni, Cr and Ti is as follows: 3% by weight of Cr, 15% by weight of Ni, 6% by weight of Ti, the balance being Fe.

For Trial 13, the composition of the intermediate coating comprising Fe, Ni, Cr and Ti is as follows: 3% by weight of Cr, 40% by weight of Ni, 10% by weight of Ti, the balance being Fe.

Trials 10 to 13 were subjected to the steps described below:
  Insertion of the strip into a vacuum chamber having a pressure $P<10^{-3}$ mbar.
  Vacuum evaporation deposition of a layer of 10 nm of Fe—Ni—Cr—Ti coating.
  Vacuum evaporation deposition of a layer of 5 μm of zinc.

The characteristics of each Trial are presented in the table below:

| Specimen number | Brightening | Etching | Coating |
|---|---|---|---|
| 1 | H2SO4 | No | Stainless 316 |
| 2 | H2SO4 | Yes | No |
| 3 | H2SO4 | No | No |
| 4 | H2SO4 | No | Ti |
| 5 | HCOOH | No | Stainless 316 |
| 6 | HCOOH | Yes | No |
| 7 | HCOOH | No | No |
| 8 | HCOOH | No | Ti |
| 9 | None | No | Stainless 316 |
| 10 | None | None | Fe—3Cr—15Ni—3Ti |
| 11 | None | None | Fe—3Cr—40Ni—47Ti |
| 12* | None | None | Fe—3Cr—15Ni—6Ti |
| 13* | None | None | Fe—3Cr—40Ni—10Ti |

*according to the present invention

All of these specimens were then subjected to the T-bend described above. The results are presented in the table below.

| Specimen number | T-bend |
|---|---|
| 1 | OK |
| 2 | OK |
| 3 | NOK |
| 4 | OK |
| 5 | OK |
| 6 | OK |
| 7 | NOK |
| 8 | OK |
| 9 | OK |
| 10 | NOK |
| 11 | NOK |
| 12* | OK |
| 13* | OK |

Trials 12 and 13 according to the present invention showed a good adherence of the zinc such as Trials 1, 5 and 9.

What is claimed is:

1. A coated metallic substrate comprising:
   a metallic substrate;
   an oxide layer of oxides;
   an intermediate coating layer, the oxide layer being between the metallic substrate and the intermediate coating layer and directly topped by the intermediate coating layer, the intermediate coating layer including Fe, Ni, Cr and Ti, wherein an amount of Ti is above or equal to 5 wt. % and the following equation is satisfied: 8 wt. %<Cr+Ti<40 wt. %, the balance being Fe and Ni; and
   an anticorrosion metallic coating layer directly topping the intermediate coating layer.

2. The coated metallic substrate according to claim 1, wherein the intermediate coating layer includes from 15 to 42 wt. % of Ni.

3. The coated metallic substrate according to claim 2, wherein the intermediate coating layer includes from 22 to 40 wt. % of Ni.

4. The coated metallic substrate according to claim 1, wherein the intermediate coating layer includes from 25 to 30 wt. % of Ni.

5. The coated metallic substrate according to claim 1, wherein the intermediate coating layer includes from 10 to 60 wt. % of iron.

6. The coated metallic substrate according to claim 1, wherein the intermediate coating layer includes from 30 to 60 wt. % of iron.

7. The coated metallic substrate according to claim 1, wherein the intermediate coating layer includes from 5 to 30 wt. % of Ti.

8. The coated metallic substrate according to claim 7, wherein the intermediate coating layer includes from 5 to 20 wt. % of Ti.

9. The coated metallic substrate according to claim 1, wherein the intermediate coating layer includes from 5 to 30 wt. % of Cr.

10. The coated metallic substrate according to claim 9, wherein the intermediate coating includes from 5 to 20 wt. % of Cr.

11. The coated metallic substrate according to claim 1, wherein the intermediate coating layer has a thickness between 1 and 100 nm.

12. The coated metallic substrate according to claim 11, wherein the intermediate coating layer has a thickness between 1 and 50 nm.

13. The coated metallic substrate according to claim 12, wherein the intermediate coating layer has a thickness between 1 and 20 nm.

14. The coated metallic substrate according to claim 1, wherein the metallic substrate is directly coated with a further anticorrosion layer, the further anticorrosion layer being directly topped by the oxide layer of oxides.

15. The coated metallic substrate according to claim 1, wherein the anticorrosion metallic coating layer includes a metal selected from among the group consisting of: zinc, aluminum, copper, silicon, iron, magnesium, titanium, nickel, chromium, manganese and alloys between metals of the group.

16. The coated metallic substrate according to claim 15, wherein the anticorrosion metallic coating layer is an aluminum-based coating including less than 15 wt. % Si, less than 5.0 wt. % Fe, optionally 0.1 to 8.0 wt. % Mg and optionally 0.1 to 30.0 wt. % Zn, the remainder being Al.

17. The coated metallic substrate according to claim 15, wherein the anticorrosion metallic coating layer is a zinc-based coating comprising 0.01-8.0 wt. % Al, optionally 0.2-8.0 wt. % Mg, the remainder being Zn.

18. The coated metallic substrate according to claim 1, wherein the metallic substrate is chosen among: aluminum substrate, steel substrate, stainless steel substrate, copper substrate, iron substrate, copper alloy substrate, titanium substrate, cobalt substrate or nickel substrate.

19. The coated metallic substrate according to claim 18, wherein the metallic substrate is a steel sheet.

20. A part of an automotive vehicle comprising the coated metallic substrate according to claim 1.

21. The coated metallic substrate according to claim 1, wherein the intermediate coating layer consists of Fe, Ni, Cr, and Ti.

22. A method for the manufacture of a coated metallic substrate according to claim 1 comprising the following steps:
   providing the metallic substrate having the oxide layer of oxides;
   depositing the intermediate coating layer by vacuum deposition or electro-deposition process; and
   depositing the anticorrosion metallic coating layer.

23. The method according to claim 22, wherein the depositing of the intermediate coating layer is performed by a magnetron cathode pulverization process or a jet vapor deposition process.

24. The method according to claim 22, wherein the depositing of the anticorrosion metallic coating layer is performed by a hot-dip coating, by electro-deposition process or by vacuum deposition.

25. The method according to claim 22, wherein the depositing of the anticorrosion metallic coating layer is performed by a magnetron cathode pulverization process or jet vapor deposition process.

26. The method according to claim 22, wherein the method excludes a pickling for removing any of the oxides in the oxide layer on the metallic substrate prior to the depositing of the intermediate coating layer.

* * * * *